United States Patent
Goodwin et al.

(10) Patent No.: US 7,545,651 B2
(45) Date of Patent: Jun. 9, 2009

(54) MEMORY MODULE WITH A PREDETERMINED ARRANGEMENT OF PINS

(75) Inventors: June E. Goodwin, Plano, TX (US); Michael C. Day, Allen, TX (US); Brian M. Johnson, Allen, TX (US); John A. Nerl, Londonderry, NH (US); Richard A. Schumacher, Dallas, TX (US); Vicki L. Smith, N.W. Province (CM)

(73) Assignee: Hewlett-Packard Development Company, L.P., Houston, TX (US)

( * ) Notice: Subject to any disclaimer, the term of this patent is extended or adjusted under 35 U.S.C. 154(b) by 464 days.

(21) Appl. No.: 11/108,245

(22) Filed: Apr. 18, 2005

(65) Prior Publication Data

US 2006/0245119 A1    Nov. 2, 2006

(51) Int. Cl.
*H05K 1/18* (2006.01)
(52) U.S. Cl. .................. 361/764; 361/763; 361/782; 361/803; 365/51
(58) Field of Classification Search ......... 361/760–765, 361/782–785, 803; 365/51, 63
See application file for complete search history.

(56) References Cited

U.S. PATENT DOCUMENTS

| | | | |
|---|---|---|---|
| 5,012,389 A | 4/1991 | Perry | |
| 5,513,135 A * | 4/1996 | Dell et al. | 365/52 |
| 6,078,515 A * | 6/2000 | Nielsen et al. | 365/63 |
| 6,097,619 A * | 8/2000 | Nguyen et al. | 365/63 |
| 6,137,709 A * | 10/2000 | Boaz et al. | 365/51 |
| 6,210,175 B1 * | 4/2001 | Payne | 439/69 |
| 6,502,161 B1 * | 12/2002 | Perego et al. | 711/5 |
| 6,625,687 B1 * | 9/2003 | Halbert et al. | 711/105 |
| 6,658,530 B1 * | 12/2003 | Robertson et al. | 711/115 |
| 6,667,895 B2 * | 12/2003 | Jang et al. | 365/63 |
| 6,711,666 B1 | 3/2004 | Feldman | |
| 6,956,387 B2 * | 10/2005 | Ho et al. | 324/755 |
| 7,224,595 B2 * | 5/2007 | Dreps et al. | 365/63 |

OTHER PUBLICATIONS

PC2-3200/PC2-4300 DDR2 Registered DIMM Reference Design Specification, Rev. 1.0, pp. 1-45 (Jan. 30, 2003).
PC2-5300/PC2-4200/PC2-3200 Registered DIMM Design Specification, Rev. 2.0 for BOD Ballot (Draft), pp. 1-86 (Oct. 4, 2004).

* cited by examiner

*Primary Examiner*—Tuan T Dinh

(57) ABSTRACT

A memory module according to one implementation includes a support substrate, plural memory devices mounted on the support substrate, and pins having a predetermined arrangement on the support substrate, the pins comprising signal pins connected to the memory devices, power pins, and ground pins. In the predetermined arrangement of pins, each signal pin uses a ground pin as a reference, and each power pin is adjacent a ground pin for reduced impedance between the power pin and ground pin. In some implementations, some of the signal pins are associated with redundant pins.

12 Claims, 6 Drawing Sheets

| PIN # | SIGNAL NAME | PIN # | SIGNAL NAME |
|---|---|---|---|
| 1 | DIMM_CLK_RESET_L | 140 | SPD_ADD[2] |
| 2 | DIMM_PWR_RST_L | 141 | SPD_ADD[0] |
| 3 | GND | 142 | SPD_ADD[1] |
| 4 | VDD | 143 | SDA |
| 5 | GND | 144 | SCL |
| 6 | VDD | 145 | VDDSPD |
| 7 | GND | 146 | GND |
| 8 | DQ[0] | 147 | DQ[4] |
| 9 | DQ[1] | 148 | DQ[5] |
| 10 | GND | 149 | GND |
| 11 | DQS_H[0] | 150 | DQS_H[1] |
| 12 | DQS_L[0] | 151 | DQS_L[1] |
| 13 | GND | 152 | GND |
| 14 | DQ[2] | 153 | DQ[6] |
| 15 | DQ[3] | 154 | DQ[7] |
| | GAP 130 FOR KEYING FEATURES ON CONNECTOR | | |
| 16 | DQ[8] | 155 | DQ[12] |
| 17 | DQ[9] | 156 | DQ[13] |
| 18 | GND | 157 | GND |
| 19 | DQS_H[2] | 158 | VDD |
| 20 | DQS_L[2] | 159 | GND |
| 21 | GND | 160 | DQS_H[3] |
| 22 | DQ[10] | 161 | DQS_L[3] |
| 23 | DQ[11] | 162 | GND |
| 24 | DQ[16] | 163 | DQ[14] |
| 25 | DQ[17] | 164 | DQ[15] |
| 26 | GND | 165 | DQ[20] |
| 27 | DQS_H[4] | 166 | DQ[21] |
| 28 | DQS_L[4] | 167 | GND |
| 29 | GND | 168 | VDD |
| 30 | DQ[18] | 169 | VDD |
| 31 | DQ[19] | 170 | GND |
| 32 | DQ[24] | 171 | DQS_H[5] |
| 33 | DQ[25] | 172 | DQS_L[5] |
| 34 | GND | 173 | GND |
| 35 | DQS_H[6] | 174 | DQ[22] |
| 36 | DQS_L[6] | 175 | DQ[23] |
| 37 | GND | 176 | DQ[28] |
| 38 | DQ[26] | 177 | DQ[29] |
| 39 | DQ[27] | 178 | GND |

FIG. 3A

| PIN # | SIGNAL NAME | PIN # | SIGNAL NAME |
|---|---|---|---|
| 40 | DQ[32] | 179 | VDD |
| 41 | DQ[33] | 180 | VDD |
| 42 | GND | 181 | GND |
| 43 | DQS_H[8] | 182 | DQS_H[7] |
| 44 | DQS_L[8] | 183 | DQS_L[7] |
| 45 | GND | 184 | GND |
| 46 | DQ[34] | 185 | DQ[30] |
| 47 | DQ[35] | 186 | DQ[31] |
| 48 | GND | 187 | GND |
| 49 | VDD | 188 | VDD |
| 50 | GND | 189 | GND |
| 51 | ADDR[14] | 190 | APAR |
| 52 | ADDR[14] | 191 | APAR |
| 53 | BANK[0] | 192 | ADDR[4] |
| 54 | BANK[0] | 193 | ADDR[4] |
| 55 | ADDR[10] | 194 | ADDR[11] |
| 56 | ADDR[10] | 195 | ADDR[11] |
| 57 | GND | 196 | GND |
| 58 | VDD | 197 | ADDR[1] |
| 59 | GND | 198 | ADDR[1] |
| 60 | ADDR[5] | 199 | RAS_L |
| 61 | ADDR[5] | 200 | RAS_L |
| 62 | WE_L | 201 | ADDR[6] |
| 63 | WE_L | 202 | ADDR[6] |
| 64 | ADDR[3] | 203 | GND |
| 65 | ADDR[3] | 204 | CK_H |
| 66 | ADDR[2] | 205 | CK_L |
| 67 | ADDR[2] | 206 | GND |
| | GAP 130 FOR KEYING FEATURES ON CONNECTOR | | |
| 68 | CAS_L | 207 | CS_L[0] |
| 69 | CAS_L | 208 | CS_L[0] |
| 70 | GND | 209 | GND |
| 71 | VDD | 210 | VDD |
| 72 | GND | 211 | GND |
| 73 | ADDR[9] | 212 | BANK[2] |
| 74 | ADDR[9] | 213 | BANK[2] |
| 75 | ADDR[7] | 214 | ADDR[13] |
| 76 | ADDR[7] | 215 | ADDR[13] |
| 77 | ADDR_0 | 216 | PAR_ERR_L |
| 78 | ADDR_0 | 217 | PAR_ERR_L |
| 79 | GND | 218 | GND |
| 80 | VDD | 219 | VDD |
| 81 | GND | 220 | GND |
| 82 | BANK[1] | 221 | ADDR[8] |
| 83 | BANK[1] | 222 | ADDR[8] |

FIG. 3B

| PIN # | SIGNAL NAME | PIN # | SIGNAL NAME |
|---|---|---|---|
| 84 | ODT[0] | 223 | ADDR[12] |
| 85 | ODT[0] | 224 | ADDR[12] |
| 86 | ODT[1] | 225 | GND |
| 87 | ODT[1] | 226 | VDD |
| 88 | GND | 227 | GND |
| 89 | CKE | 228 | CS_L[1] |
| 90 | CKE | 229 | CS_L[1] |
| 91 | CS_L[3] | 230 | CS_L[2] |
| 92 | CS_L[3] | 231 | CS_L[2] |
| 93 | GND | 232 | GND |
| 94 | DQ[71] | 233 | DQ[67] |
| 95 | DQ[70] | 234 | DQ[66] |
| 96 | GND | 235 | GND |
| 97 | VDD | 236 | VDD |
| 98 | GND | 237 | GND |
| 99 | DQS_L[17] | 238 | DQS_L[16] |
| 100 | DQS_H[17] | 239 | DQS_H[16] |
| 101 | GND | 240 | GND |
| 102 | DQ[69] | 241 | DQ[65] |
| 103 | DQ[68] | 242 | DQ[64] |
|  | GAP 130 FOR KEYING FEATURES ON CONNECTOR | | |
| 104 | DQ[63] | 243 | DQ[59] |
| 105 | DQ[62] | 244 | DQ[58] |
| 106 | GND | 245 | GND |
| 107 | DQS_L[15] | 246 | DQS_L[14] |
| 108 | DQS_H[15] | 247 | DQS_H[14] |
| 109 | GND | 248 | GND |
| 110 | DQ[61] | 249 | VDD |
| 111 | DQ[60] | 250 | VDD |
| 112 | DQ[55] | 251 | GND |
| 113 | DQ[54] | 252 | DQ[57] |
| 114 | GND | 253 | DQ[56] |
| 115 | VDD | 254 | DQ[51] |
| 116 | GND | 255 | DQ[50] |
| 117 | DQS_L[13] | 256 | GND |
| 118 | DQS_H[13] | 257 | VDD |
| 119 | GND | 258 | VDD |
| 120 | DQ[53] | 259 | GND |
| 121 | DQ[52] | 260 | DQS_L[12] |
| 122 | DQ[47] | 261 | DQS_H[12] |
| 123 | DQ[46] | 262 | GND |
| 124 | GND | 263 | VDD |
| 125 | DQS_L[11] | 264 | VDD |
| 126 | DQS_H[11] | 265 | GND |
| 127 | GND | 266 | DQ[49] |

FIG. 3C

| PIN # | SIGNAL NAME | PIN # | SIGNAL NAME |
|---|---|---|---|
| 128 | VDD | 267 | DQ[48] |
| 129 | GND | 268 | DQ[43] |
| 130 | DQ[45] | 269 | DQ[42] |
| 131 | DQ[44] | 270 | GND |
| 132 | DQ[39] | 271 | VDD |
| 133 | DQ[38] | 272 | VDD |
| 134 | GND | 273 | GND |
| 135 | DQS_L[9] | 274 | DQS_L[10] |
| 136 | DQS_H[9] | 275 | DQS_H[10] |
| 137 | GND | 276 | GND |
| 138 | DQ[37] | 277 | DQ[41] |
| 139 | DQ[36] | 278 | DQ[40] |

FIG. 3D

MEMORY MODULE WITH A PREDETERMINED ARRANGEMENT OF PINS

BACKGROUND

In modern computers or other electronic devices, increasing the size of memory usually leads to enhanced performance. The memory of a computer or other electronic device is typically volatile storage (implemented in the form of dynamic or static random access memories) provided between a processor and persistent storage (typically implemented with disk-based storage devices).

The memory is implemented with memory devices having faster access speeds than persistent storage. The memory devices are usually provided in memory modules, with each memory module having plural memory devices.

Examples of memory modules include single in-line memory modules (SIMMs) or dual in-line memory modules (DIMMs). A DIMM may have a data path that is larger than a data path of a SIMM. A memory module, such as a SIMM or DIMM, typically has a support substrate on which memory devices can be mounted on both sides of the support substrate. The electrical contact pins of the memory module are also provided on both sides of the support substrate. The electrical contact pins are connected to corresponding contact points in a connector of a system board. The electrical contact pins of the memory module, when inserted in a system board connector, connect power and ground voltages, address signals, data signals, and control signals to the memory devices on the memory module.

Various issues are associated with conventional memory modules. One is the issue of noise on power lines on the memory module. The power lines connect power voltages from the power pins to the memory devices. Conventional memory modules usually employ two different sets of power pins, with one set of power pins used to power the core circuitry of each memory device, and another set of power pins used for powering the input/output (I/O) circuitry of each memory device. The core circuitry of a memory device refers to the memory cells and associated peripheral circuitry around the memory cells of the memory device. The I/O circuitry refers to the input/output buffers and drivers of the memory device. The presence of the two sets of power pins means that decoupling capacitors on the memory module cannot be shared for reducing noise. The inability to share decoupling capacitors makes the memory module layout more complex and inefficient.

Another issue associated with conventional memory modules is that power pins of the memory module may be spaced apart from ground pins by intervening signal pins. This spaced apart relationship between power and ground pins increases the impedance between the power and ground pins, which leads to increased noise on a memory module. Also, in some conventional memory modules, some signal pins use a power pin (instead of a ground pin) as a reference, which also leads to increased noise, if proper decoupling is not used to tie the planes together to form a low impedance path between the planes at all relevant frequencies.

A further issue of conventional memory modules is reduced reliability in light of the large number of pins that are provided on the memory module. For example, the Joint Electron Device Engineering Council (JEDEC) has defined a pin arrangement of a DIMM with 240 pins. With such a large number of pins, the likelihood that any one DIMM pin may experience poor electrical connection with a corresponding contact point of a system board connector is increased. If the pin with a poor electrical connection is an address pin or control pin, then one or more of the memory devices on the DIMM may not function properly.

BRIEF DESCRIPTION OF THE DRAWINGS

FIGS. 3A-3D illustrates a table that depicts an arrangement of pins of a memory module, in accordance with an exemplary embodiment.

DETAILED DESCRIPTION

Figure 1:
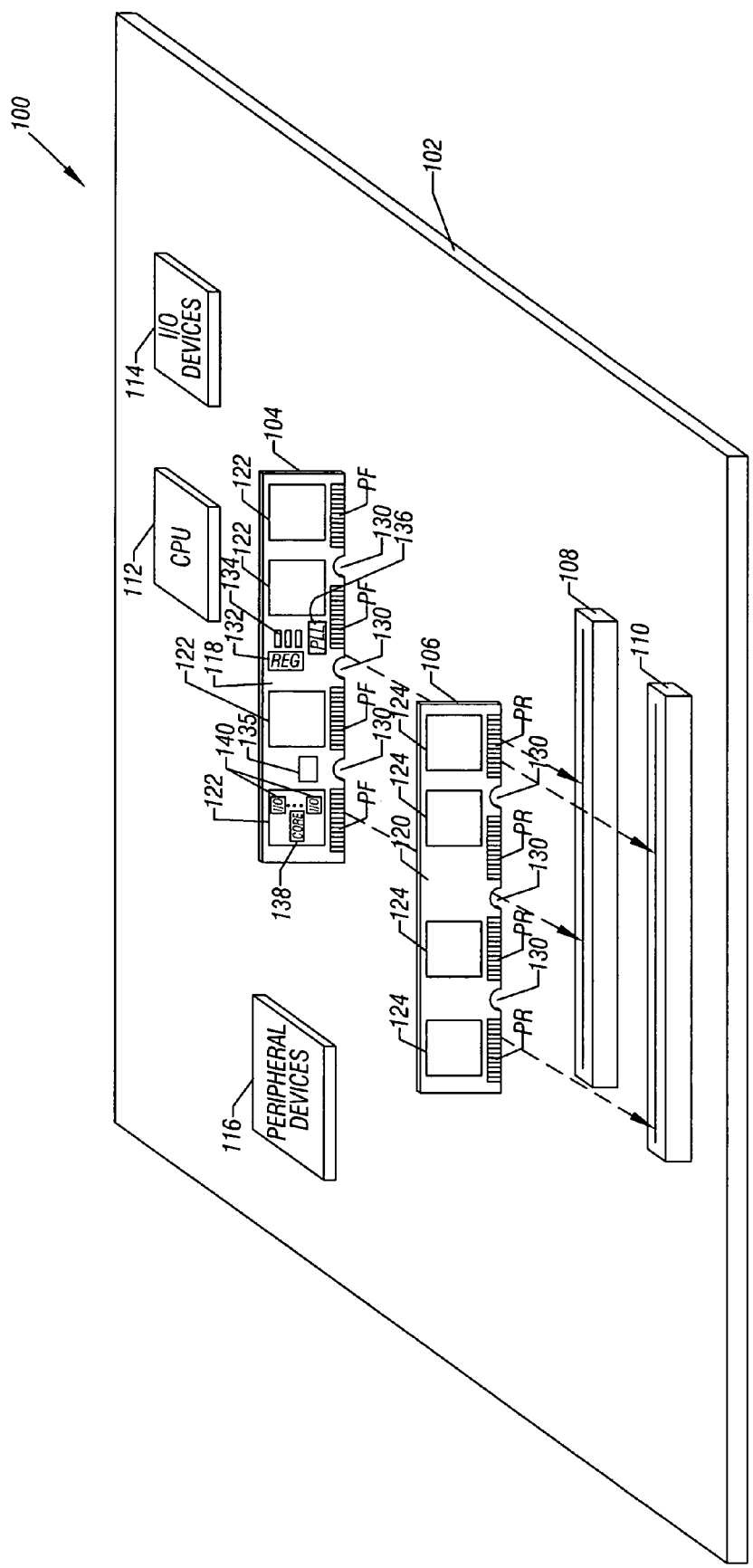
FIG. 1 illustrates an example system having memory modules having a pin arrangement according to some embodiments of the invention.

FIG. 1 illustrates an example system 100 (e.g., a computer or other type of electronic system) that has a system board 102. One or more central processing units (CPUs) 112 are mounted on the system board 102. Also mounted on the system board 102 are input/output (I/O) devices 114 and peripheral devices 116. Connectors 108 and 110 are also provided on the system board 102. The system board connectors 108, 110 are adapted to receive respective memory modules 104, 106. Each memory module 104, 106 has an arrangement of pins PF, PR (discussed further below) to electrically contact corresponding contact points of a respective connector 108, 110. The pins PF, PR of each memory module 104, 106 have a predetermined arrangement according to some embodiments, described further below.

The architecture of the system 100 depicted in FIG. 1 is exemplary as other architectures can be employed in other implementations. Also, although two system board connectors 108, 110 are depicted to receive two respective memory modules, it is contemplated that the system board can be provided with only one system board connector or more than two system board connectors in other implementations.

In FIG. 1, the front side 118 of the memory module 104 is illustrated, while the rear side 120 of the memory module 106 is illustrated. Usually, the memory modules 104, 106 would be mounted into the connectors 108, 110 with their respective front sides and rear sides facing the same way. However, the memory modules 104 and 106 are depicted in FIG. 1 as facing in different directions to enable both the front and rear sides of the memory modules to be shown. The memory modules 104 and 106 are identical memory modules.

As depicted in FIG. 1, memory devices 122 are mounted on the front side 118 of the memory module 104, and memory devices 124 are mounted on the rear side 120 of the memory module 106. In the embodiment of FIG. 1, each memory module 104 is a dual in-line memory module (DIMM). However, although reference is made to a DIMM in the description, it is contemplated that embodiments of the invention can be applied to other types of memory modules, such as single in-line memory modules (SIMMs) and others.

In a DIMM, pins PF (on the front side 118) and pins PR (on the rear side 120) can be connected to different memory devices to enable a wider data path to be used. As used here, the term "pin" refers to an electrical contact, pad, or any other electrically conductive structure that can be electrically connected to a corresponding electrically conductive structure in a respective connector 108, 110 to enable communication between the memory module and the devices on the system board 102.

It is noted that the front side of the memory module 106 is the same as the front side 118 of memory module 104, and that the rear side of the memory module 104 is the same as the rear side 120 of the memory module 106. Thus, the memory devices 122 are mounted on the front side of each of memory modules 104, 106; and the memory devices 124 are mounted on the rear side of each of memory modules 104, 106. Similarly, the pins PF are formed on the front side of each of memory modules 104, 106; and the pins PR are formed on the rear side of each of memory modules 104, 106.

In the example implementation shown in FIG. 1, gaps 130 are formed at particular positions between multiple subsets of pins PF, PR. The gaps 130 are provided to mate with keying profiles of each connector 108, 110. In a different implementation, a different number of gaps 130 can be used (one or greater). In yet another implementation, the gaps 130 can be omitted.

The front side 118 of each memory module includes a register 132. The register 132 is used to buffer address and control signals for the memory devices of the memory module. Another component on the memory module is a non-volatile storage 135, such as an electrically erasable and programmable read-only memory (EEPROM) or flash memory, that stores serial presence detect information. Serial presence detect information includes memory size, data width, speed, voltage, and other information. Although a register is not shown on the rear side 120 of the memory module, it is contemplated that other implementations can employ a register on the rear side 120 as well. Also, instead of being provided on the front side 118, the non-volatile storage 135 can be provided on the rear side 120.

Also provided on the front side 118 of the memory module are various electrical circuitry 134, which includes decoupling capacitors, terminating components, and other components. Decoupling capacitors are used for decoupling noise from power pins, whereas terminating components are used for terminating signal pins for matching impedances. Another device mounted on the front surface 118 is a phase locked loop (PLL) device 136 for generating clock signals to the memory devices 122, 124. Instead of being formed on the front surface 118, the electrical circuitry 134 and PLL device 136 can alternatively be formed on the rear side 120. In yet other implementations, the PLL device 136 can be omitted.

Each memory module has the following arrangement of pins 126, 128 for enhanced performance. The pins PF, PR include power pins, ground pins, and signal pins. Power pins are connected to power supply voltages on the system board 102 through a respective connector 108, 110. A power supply voltage is a voltage provided by a power supply of the system. A ground pin is connected to a ground reference of the system through a respective connector 108, 110. A signal pin refers to a pin for carrying a signal that communicates information (control information, address information, data information, test information, and so forth) between the memory devices on the memory module and devices on the system board 102. The signal pins include address signal pins (for carrying address information to address a memory device of the memory module), control pins (for carrying control information to a memory device of the memory module), data pins (for carrying data, such as read data or write data, to and from the memory device), and other types of signal pins.

Common power pins of the memory module are shared by both the core circuitry 138 and I/O circuitry 140 of each memory device 122, 124. The core circuitry 138 of a memory device refers to the memory cells and surrounding peripheral circuitry that communicates with the memory cells of the memory device. The I/O circuitry 140 refers to the input buffers, output buffers, and output drivers of the memory device. Some conventional memory modules employ two different sets of power pins, with one set connected to the core circuitry 138 of the memory devices, and the other set of power pins connected to the I/O circuitry of the memory devices. The use of two different sets of power pins adds complexity to the layout of the memory module 104, 106, since multiple sets of decoupling capacitors would have to be used.

In accordance with some embodiments of the invention, because the core circuitry 138 and I/O circuitry 140 of each memory device share a common set of power pins on the memory module 104, 106, a common set of one or more decoupling capacitors can be shared. The sharing of decoupling capacitors simplifies the layout of the memory module 104, 106, and makes usage of space on the memory module 104, 106 more efficient.

Another feature provided by some embodiments of the invention is that each power pin of the memory module 104, 106 is placed adjacent a ground pin. A power pin is "adjacent" a ground pin if there is no other intervening pin between the power pin and the ground pin. Placing a power pin adjacent a ground pin reduces the impedance of the power path from the power pin to the ground pin, which leads to reduction of power noise on the memory module 104, 106.

A further feature of some embodiments of the invention of the memory module 104, 106 is that all signal pins connected to memory devices use ground as a reference. The arrangement where all signal pins connected to memory devices use ground as a reference is accomplished by ensuring that no power pin is provided between any signal pin connected to a memory device and a ground pin. Referencing a signal pin to ground voltage rather than a power voltage leads to reduced noise since there is less impedance between the signal pin and ground. Note, however, that according to some embodiments, the signal pins connected to the non-volatile storage 135 may use a power pin as a reference, rather than ground.

Another further feature of some embodiments of the invention is that redundant address and control pins are provided on the memory module 104, 106. Address pins are connected to respective address bits, and control pins are connected to respective control signals.

In one embodiment, each of at least some address bits is connected to a pair of redundant address pins, and each of at least some control signals is connected to a pair of redundant control pins. For example, in one implementation, there are fifteen address bits provided by address pins ADDR[0:14]. A pair of redundant ADDR[14] pins are provided on the memory module, a pair of redundant ADDR[13] pins are provided; and so forth. Thus, if one ADDR[x] (x=0-14) pin has a poor electrical contact with a corresponding contact point on the system board connector 108, 110, then the other redundant ADDR[x] pin can be used for providing the ADDR [x] bit. The redundant address pins, along with the redundant control pins, enable more reliable performance of the memory module.

The table depicted in FIGS. 3A-3D lists the arrangement of the pins PF, PR (FIG. 1) of the memory module. in accordance with one exemplary embodiment. In the implementation of the table of FIGS. 3A-3D, there are 278 pins. Pins 1-139 make up pins PF (on the front side of each memory module), and pins 140-278 make up pins PR (on the rear side of each memory module).

The 278-pin arrangement is exemplary. as other embodiments can use different arrangements to achieve one or more of the features discussed above. A brief discussion of the pins in the arrangement of FIGS. 3A-3D is provided below.

The VDD pins are power pins connected to a power supply voltage. The VDDSPD pin is the power pin to the non-volatile storage 135 containing serial presence detect information.

The GND pins are ground pins. In the arrangement of FIGS. 3A-3D. there are a greater number of ground pins than power pins.

The DQ[0:71] pins are data input and output pins (making up a 64-bit wide data path with eight check bits in this implementation). The DQS_H[0:17] pins and DQS_L[0:17] pins are data strobe pins for strobing write data on the DQ pins into the memory devices, and for indicating when valid data appears at the outputs of the memory devices. Each pair of DQS_H[x] and DQS_L[x] signals forms a differential data strobe for the e input and output data.

The ADDR[1:14] pins provide the 14 most significant address bits, while the ADDR_0 pins provide the least significant address bit. For redundancy, there are two redundant ADDR_0 pins, two ADDR[1] pins, two ADDR[2] pins, and so forth.

The BANK[0:2] are bank addresses used for selecting one of multiple banks of memory internal to a memory device. The memory devices 122, 124 on each memory module can be organized into multiple banks of memory. Note that two redundant BANK[0] pins, two redundant BANK[1] pins, and two redundant BANK[2] pins are provided. The APAR pins (two redundant pins) provide the address and control bus parity bit.

The CAS_L pins (two redundant pins) provide the column address strobe for strobing a column address (on the ADDR pins) into the memory devices. The RAS_L pins (two redundant pins) provide the row address strobe for strobing a row address (on the ADDR pins) into the memory devices.

The WE_L pins (two redundant pins) provide the write enable to indicate a write operation is occurring. The CS_L[0:3] pins provide the chip select signals to decoders in different banks of memory devices. Note that each CS_L[x] (x=0-3) is associated with two redundant pins. The CKE pins (two redundant pins) are clock enable pins for activating internal clocks, input buffers, and output drivers of the memory devices.

The ODT[0:1] pins provide indications of whether signal pins of the memory module are to be terminated by the memory module (using the terminating components discussed above). Note that the signal pins may be shared by multiple memory modules, and may be terminated by only one of the memory modules. A redundant pair of each of the ODT[0] and ODT[1] pins are provided.

The PAR_ERR_L pins (two redundant pins) indicate whether a parity error has been detected for the address or control bus.

The DIMM_CLK_RESET_L pin controls when in the power-on process the PLL device 136 (FIG. 1) is to activate clock signals to the memory devices. The DIMM_P-WR_RST_L pin controls the reset of the register 132 (FIG. 1). The CK_H and CK_L pins form a differential pair of system clock inputs that drives input to the PLL device 136.

The SCL pin provides the signal to clock data into and out of the serial presence detect non-volatile storage. The SDA pin is used to transfer data into and out of the serial presence detect non-volatile storage. The SPD_ADD[0:2] pins are used to configure the address range of the serial presence detect non-volatile storage.

In the example arrangement of pins provided above, each power pin (VDD or VDDSPD) is provided adjacent a ground pin (GND) without an intervening other pin, such as a signal pin. Each of certain signal pins (such as signal pins connected to the memory device) uses a ground pin as a reference. For example, pins 153-156 (corresponding to DQ[6, 7, 12, 13]) use either pin 152 or pin 157 as the ground reference. On the other hand, pins 140-144 (corresponding to SPD_ADD[2], SPD_ADD[0], SPD_ADD[1], SDA, SCL), which are connected to the serial presence detect non-volatile storage, use VDDSPD as the reference. Low-speed signals such as these do not require the proximity reference to ground as other DIMM signals do. However, in different implementations, the serial presence detect signals can use ground as a reference.

The example pin arrangement in the table of FIGS. 3A-3D also shows that certain address and control pins are redundant to enhance reliability. In the exemplary embodiment above, the address pins and control pins connected to the memory devices have corresponding redundant pins. Also, the memory devices 122, 124 receive only one type of power input (from the VDD pins). In this manner, no distinction is made between the core circuitry and I/O circuitry of the memory devices, thereby enabling the sharing of decoupling capacitors by the VDD pins.

Figure 2:
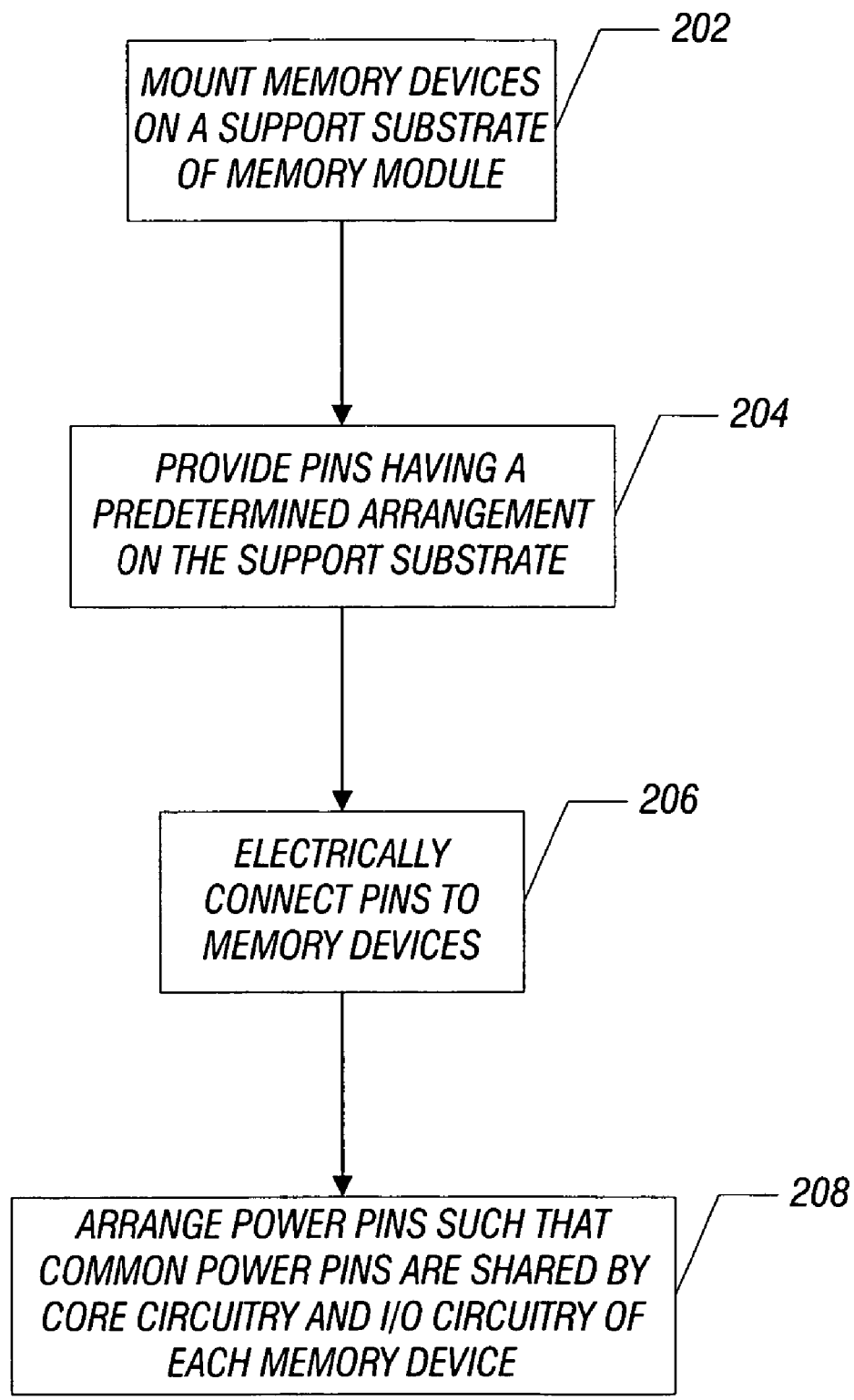
FIG. 2 is a flow diagram of a process according to an embodiment.

FIG. 2 is a flow diagram of a process according to an embodiment. Memory devices are mounted (at 202) on a support substrate of a memory module (e.g., the first side and/or second side). Pins, including signal pins, power pins, and ground pins, are provided (at 204) on the support substrate, with the pins having a predetermined arrangement. Certain pins on the support substrate are electrically connected (at 206) to the memory devices. The predetermined arrangement of pins includes one or more of the following features: (1) each signal pin connected to a memory device uses a ground pin as a reference; (2) each power pin is adjacent a ground pin; and (3) redundant pins are provided for some of the signal pins. In addition, the power pins are arranged (at 208) such that common power pins are shared by the core circuitry and input/output circuitry of each memory device.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A memory module comprising:
a support substrate;
plural memory devices mounted on the support substrate; and
pins having a predetermined arrangement on the support substrate, the pins comprising signal pins connected to the memory devices, power pins, and ground pins,
in the predetermined arrangement of pins, each signal pin using a corresponding one of the ground pins but not any power pin as a reference, and each power pin being adjacent a corresponding one of the ground pins for reduced impedance between the power pin and ground pin,
wherein each power pin is adjacent a corresponding one of the ground pins without another intervening pin between the adjacent power and ground pins,
wherein each memory device has core circuitry and input/output circuitry, and wherein common power pins are shared by the core circuitry and input/output circuitry of each memory device.

2. The memory module of claim 1, further comprising at least one decoupling capacitor, the common power pins sharing the at least one decoupling capacitor.

3. The memory module of claim 1, wherein the signal pins comprise address pins and control pins, at least some of the address and control pins associated with respective redundant address and control pins.

4. The memory module of claim 1, comprising a dual in-line memory module, the dual in-line memory module having a first side and a second side, a portion of the memory devices and pins provided on the first side, and another portion of the memory devices and pins provided on the second side.

5. The memory module of claim 3, comprising a dual in-line memory module.

6. A system comprising:
   a processor; and
   a memory module coupled to the processor, the memory module having:
   a support substrate;
   memory devices mounted on the support substrate, each memory device having core circuitry and input/output circuitry;
   pins on the support substrate, the pins comprising signal pins, power pins, and ground pins,
   wherein each power pin is arranged adjacent a corresponding one of the ground pins to reduce impedance between the power pin and ground pin, and
   wherein each signal pin connected to a memory device uses a corresponding one of the ground pins as a reference, where the signal pin is in closer proximity to the corresponding ground pin used by the signal pin as a reference than to any power pin,
   wherein the signal pins comprise address pins and control pins, at least some of the address pins and control pins being redundant pins, wherein the address pins provide address bits, each address bit provided by at least two redundant address pins, and wherein the control pins provide control signals, each control signal provided by at least two redundant control pins.

7. The system of claim 6, wherein the memory module has a greater number of ground pins than power pins.

8. The system of claim 6, wherein the memory module comprises a first memory module, the system further comprising a second memory module that has a support substrate, memory devices, and pins arranged identically to the support substrate, memory devices, and pins of the first memory module.

9. The system of claim 6, wherein the memory module comprises at least one decoupling capacitor, the common set of one or more power pins sharing the at least one decoupling capacitor.

10. The system of claim 8, wherein the memory modules comprise dual in-line memory modules.

11. A system comprising:
    support means for mounting memory devices in a memory module;
    means for electrically connecting pins on the support substrate to the memory devices, the pins including signal pins, power pins, and ground pins, wherein redundant pins are provided for at least some of the signal pins; and
    means for arranging each of the signal pins connected to the memory devices to use a corresponding one of the ground pins but not any power pin as a reference,
    wherein the arranging means further comprises means for arranging each power pin adjacent a corresponding one of the ground pins without any intervening pin between the adjacent power and ground pins,
    wherein each memory device has core circuitry and input/output circuitry, wherein the arranging means comprises means for arranging common rower pins shared by the core circuitry and input/output circuitry of each memory device.

12. The memory module of claim 3, further comprising serial presence detect signal pins that use one of the power pins as a reference.

* * * * *

UNITED STATES PATENT AND TRADEMARK OFFICE
CERTIFICATE OF CORRECTION

| | |
|---|---|
| PATENT NO. | : 7,545,651 B2 |
| APPLICATION NO. | : 11/108245 |
| DATED | : June 9, 2009 |
| INVENTOR(S) | : June E. Goodwin et al. |

It is certified that error appears in the above-identified patent and that said Letters Patent is hereby corrected as shown below:

In column 8, line 7, in Claim 8, delete "substrate." and insert -- substrate, --, therefor.

In column 8, line 31, in Claim 11, delete "rower" and insert -- power --, therefor.

Signed and Sealed this

Twenty-second Day of September, 2009

David J. Kappos
*Director of the United States Patent and Trademark Office*